(12) United States Patent
Lee (10) Patent No.: US 10,128,458 B2
(45) Date of Patent: Nov. 13, 2018

(54) ROLLABLE DISPLAY DEVICE CONFIGURED TO HAVE MANY VARIATIONS IN SHAPE AND FORM

(71) Applicant: SAMSUNG DISPLAY CO., LTD., Yongin-si, Gyeonggi-do (KR)

(72) Inventor: Jongsoo Lee, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 18 days.

(21) Appl. No.: 15/581,743

(22) Filed: Apr. 28, 2017

(65) Prior Publication Data

US 2017/0325342 A1 Nov. 9, 2017

(30) Foreign Application Priority Data

May 4, 2016 (KR) ..................... 10-2016-0055582

(51) Int. Cl.
*H01L 51/52* (2006.01)
*G09F 9/30* (2006.01)
*G06F 1/16* (2006.01)
*G09G 3/00* (2006.01)

(52) U.S. Cl.
CPC ........ *H01L 51/5237* (2013.01); *G06F 1/1652* (2013.01); *G09F 9/301* (2013.01); *G09G 3/00* (2013.01); *H01L 2251/5338* (2013.01)

(58) Field of Classification Search
CPC ..................................................... G03B 21/58

USPC .......................................................... 313/511
See application file for complete search history.

(56) References Cited

U.S. PATENT DOCUMENTS

| 5,469,020 | A | * | 11/1995 | Herrick | ................. G02F 1/1365 257/E25.02 |
| 2016/0363960 | A1 | * | 12/2016 | Park | ..................... G06F 1/1656 |
| 2016/0379589 | A1 | * | 12/2016 | Longo | .................. H05K 5/0221 345/520 |
| 2017/0212556 | A1 | * | 7/2017 | Jovanovic | ............. G06F 1/1652 |
| 2017/0364122 | A1 | * | 12/2017 | Kim | ........................ G09F 9/301 |

FOREIGN PATENT DOCUMENTS

| KR | 10-2012-0134228 | 12/2012 |
| KR | 10-2014-0015881 | 2/2014 |

\* cited by examiner

*Primary Examiner* — Christopher Mahoney
(74) *Attorney, Agent, or Firm* — F. Chau & Associates, LLC (57) ABSTRACT

A rollable display device includes a display panel having a flexible property, a roller configured to receive the display panel in a rolled-up configuration, and a handle coupled to an end portion of the display panel. The rollable display device further includes a housing configured to house the roller and the display panel in the rolled-up configuration. The housing includes an outlet, which the display panel passes through in an unrolled configuration, and a first coupling hole disposed apart from the outlet and is configured to receive the handle.

20 Claims, 9 Drawing Sheets

ROLLABLE DISPLAY DEVICE CONFIGURED TO HAVE MANY VARIATIONS IN SHAPE AND FORM

CROSS-REFERENCE TO RELATED APPLICATION

This application claims priority under 35 U.S.C. § 119 to Korean Patent Application No. 10-2016-0055582 filed on May 4, 2016 in the Korean Intellectual Property Office, the disclosure of which is incorporated by reference herein in its entirety.

TECHNICAL FIELD

The present invention relates to a rollable display device, and more particularly, to a rollable display device configured to have many variations in shape and form.

DISCUSSION OF THE RELATED ART

Since the development of portable electronic devices, such as smartphones, interest in display devices that can provide convenience in portability and storage have also developed. Accordingly, a variety of flexible display devices are currently under development. For example, the variety of flexible display devices may include a curved display device, in which its entire screen is curved with a radius of curvature, a foldable display device configured to be folded about a folding axis, and a rollable display device configured to be rolled around a horizontal axis.

SUMMARY

According to an exemplary embodiment of the present invention, a rollable display device includes a display panel having a flexible property, a roller configured to receive the display panel in a rolled-up configuration, and a handle coupled to an end portion of the display panel. The rollable display device further includes a housing configured to house the roller and the display panel in the rolled-up configuration. The housing includes an outlet, which the display panel passes through in an unrolled configuration, and a first coupling hole disposed apart from the outlet and is configured to receive the handle.

In an exemplary embodiment of the present invention, the housing further includes a bottom portion, a first sidewall coupled to the bottom portion, a second sidewall coupled to the bottom portion. The first and second sidewalls face each other. The housing further includes a cover portion connecting the first and second sidewalls to each other, facing the bottom portion, and covering the roller. The first coupling hole is defined in the first sidewall, and the outlet is defined in the second sidewall.

In an exemplary embodiment of the present invention, the housing includes a second coupling hole defined in the second sidewall, and the second coupling hole is spaced apart from the outlet.

In an exemplary embodiment of the present invention, the first coupling hole is a recessed region defined in the first sidewall, the second coupling hole is a recessed region defined in the second sidewall, and the outlet is an opening region defined in the second sidewall.

In an exemplary embodiment of the present invention, the rollable display device further includes a battery disposed in the housing.

In an exemplary embodiment of the present invention, the housing includes a first magnet structure which is positioned near the outlet. The handle includes a metal material.

In an exemplary embodiment of the present invention, the housing includes a second magnet structure which is positioned near the first coupling hole. The handle includes a metal material.

In an exemplary embodiment of the present invention, the handle includes a hook portion, and the first coupling hole includes a fastening groove which corresponds to a shape of the hook portion.

In an exemplary embodiment of the present invention, the rollable display device further includes a third magnet structure which is disposed on a non-display surface of the display panel.

In an exemplary embodiment of the present invention, the rollable display device further includes a metal plate disposed between the housing and the third magnet structure.

According to an exemplary embodiment of the present invention, a rollable display device including a housing including an outlet, a roller disposed in the housing, a display panel which is coupled to the roller and has a flexible property, and a handle coupled to an end portion of the display panel. The first portion of the display panel is rolled around the roller. A second portion of the display panel is extended from the housing through the outlet in a first direction, and the second portion of the display panel overlaps at least a first sidewall of the housing. The handle is disposed in a coupling hole defined in the housing.

In an exemplary embodiment of the present invention, the housing includes a bottom portion, the first sidewall coupled to the bottom portion, a second sidewall coupled to the bottom portion. The first and second sidewalls face each other with the roller interposed therebetween. A cover portion connecting the first and second sidewalls to each other, facing the bottom portion, and covering the roller.

In an exemplary embodiment of the present invention, the coupling hole is defined in the first sidewall, and the outlet is defined in the second sidewall.

In an exemplary embodiment of the present invention, the coupling hole and the outlet are defined in one of the first or second sidewalls and are spaced apart from each other.

In an exemplary embodiment of the present invention, the coupling hole includes a first coupling hole defined in the first sidewall and a second coupling hole defined in the second sidewall. The outlet is defined in the second sidewall and is spaced apart from the second coupling hole. The handle is disposed in one of the first or second coupling holes.

In an exemplary embodiment of the present invention, the rollable display device further includes a battery disposed in the housing.

In an exemplary embodiment of the present invention, the housing includes a first magnet structure which is positioned near the outlet. The handle includes a metal material.

In an exemplary embodiment of the present invention, the housing includes a second magnet structure which is positioned near the coupling hole. The handle includes a metal material.

In an exemplary embodiment of the present invention, the handle includes a hook portion, and the coupling hole includes a fastening groove which corresponds to a shape of the hook portion.

In an exemplary embodiment of the present invention, the rollable display device further includes a metal plate disposed on each of the bottom and cover portions of the housing, a third magnet structure disposed on a non-display surface of the display panel, and a metal plate disposed between the housing and the third magnet structure.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Exemplary embodiments of the present invention will be described more fully with reference to the accompanying drawings. It is to be understood that exemplary embodiments of the present invention may have many different forms and thus should not be construed as being limited to the embodiments set forth herein. Further, the drawings are not to scale and might not precisely reflect the precise structural or performance characteristics of any given exemplary embodiment, and should not be interpreted as defining or limiting the range of values or properties encompassed by exemplary embodiments of the present invention. For example, the relative thicknesses and positioning of molecules, layers, regions and/or structural elements may be reduced or exaggerated for clarity. Like reference numerals in the drawings may denote like elements or features, and thus their description may be omitted.

It will be understood that when an element is referred to as being "connected" or "coupled" to another element, the element may be directly connected or coupled to the other element or intervening elements. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the spirit and scope of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, in the example, terms "below" and "beneath" may encompass both an orientation of above, below and beneath. The device may be otherwise oriented (e.g., rotated 90 degrees or at other orientations) and the spatially relative descriptors used herein may be interpreted accordingly.

As used herein, the singular forms "a," "an" and "the" are intended to include the plural forms as well, unless the context clearly indicates otherwise.

Figure 1A:
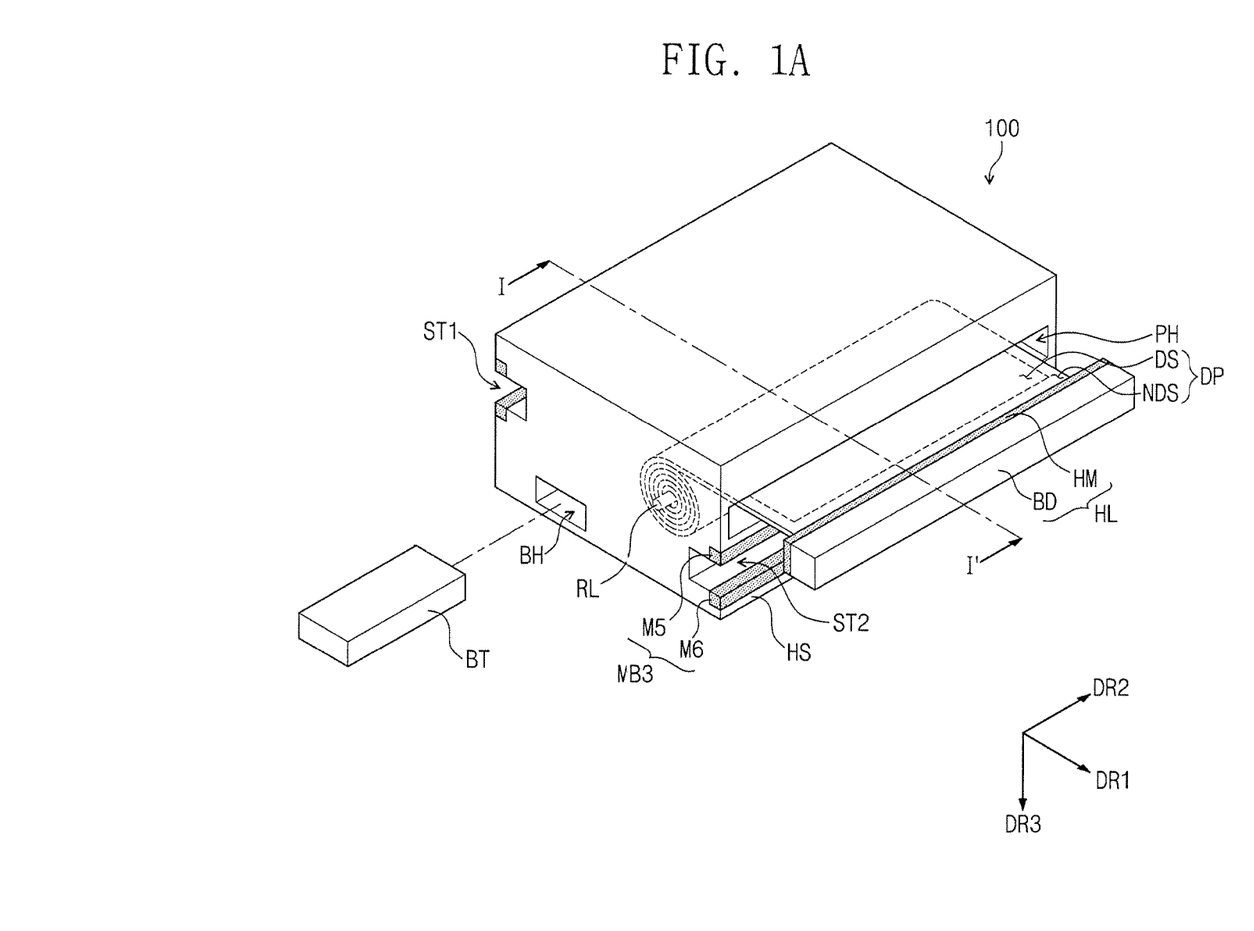
FIGS. 1A and 1B are perspective views illustrating a rollable display device according to an exemplary embodiment of the present invention.
Figure 1B:
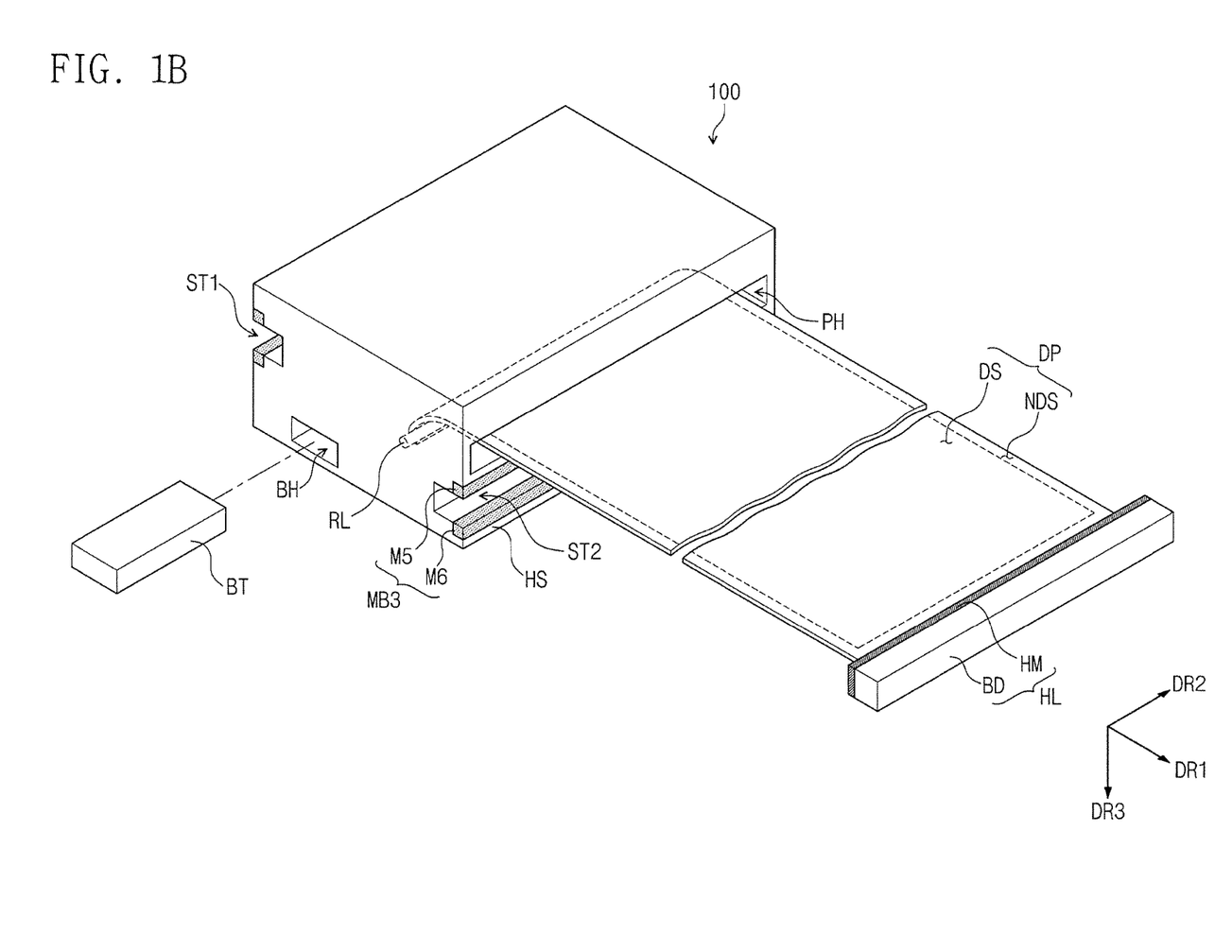

FIGS. 1A and 1B are perspective views illustrating a rollable display device 100 according to an exemplary embodiment of the present invention. In detail, FIG. 1A illustrates an example of the rollable display device 100, in which a display panel DP is rolled about a roller RL, and FIG. 1B illustrates another example of the rollable display device 100, in which the display panel DP is spread out from the roller RL.

FIGS. 1A and 1B are perspective views illustrating a rollable display device 100 according to an exemplary embodiment of the present invention.

Referring to FIGS. 1A and 1B, the rollable display device 100 may include a housing HS, a display panel DP, a roller RL, a handle HL, and a battery BT.

The housing HS may contain (e.g., house) the roller RL, the display panel DP rolled around the roller RL, and the battery BT. In an exemplary embodiment of the present invention, the housing HS may include an outlet PH (e.g., an opening in the housing HS), a first coupling hole ST1, and a second coupling hole ST2.

The display panel DP provided in the housing HS may be pulled out of the housing HS through the outlet PH. When the display panel DP is pulled out of the housing HS, the first coupling hole ST1 or the second coupling hole ST2 may be coupled to the handle HL, which is coupled to an end portion of the display panel DP. For example, the first and second coupling holes ST1 and ST2 may be configured to receive the handle HL.

The display panel DP may include a display surface DS and a non-display surface NDS, and the display surface DS of the display panel DP may be used to display an image. The display panel DP may have a flexible property so that the display panel DP may be bent, folded, or otherwise deformed. In an exemplary embodiment of the present invention, the display panel DP may include a flexible plastic substrate and a pixel layer provided on the flexible plastic substrate, and thus, the display panel DP may have the flexible property.

In an exemplary embodiment of the present invention, the display panel DP may be an organic light emitting display panel, and in this case, the pixel layer may include a plurality of pixels, each of which includes an anode, a cathode, and an organic light emitting layer provided between the anode and the cathode.

Although the display panel DP may be the organic light emitting display panel as described above, the present invention is not limited to a specific kind of display panel. For example, in exemplary embodiments of the present invention, the display panel DP may be a liquid crystal display panel, an electrophoresis display panel, or an electronic paper.

In an exemplary embodiment of the present invention, the display surface DS may have a long side, which extends parallel to a first direction DR1, and a short side, which extends parallel to a second direction DR2 substantially perpendicular to the first direction DR1. In addition, the more the display panel DP is rolled around the roller RL, the less an area of the display surface DS is visible from the outside of the housing HS. The more the display panel DP is unrolled from the roller RL, the more the area of the display surface DS is visible from the outside of the housing HS.

In an exemplary embodiment of the present invention, the rollable display device 100 may further include a window and a touch panel.

The window may be provided to cover and protect the display panel DP. In an exemplary embodiment of the present invention, the window may be a plastic film or a polymer layer that may be formed to coat the display panel DP.

The touch panel may be provided between the display panel DP and the window and may be used to obtain information on coordinates of a touch point on the display panel DP. In an exemplary embodiment of the present invention, the touch panel may be either a resistive-layer touch panel, an electrostatic-capacitance touch panel, or an electromagnetic-induction touch panel.

The handle HL may be coupled to an end portion of the display panel DP. In the case where most of the display panel DP is rolled around the roller RL (e.g., when the rollable display device 100 is used in a portable manner by a user), the handle HL may be disposed in the outlet PH of the housing HS. In the case where most of the display panel DP is unrolled from the roller RL of the rollable display device 100 to display an image, the handle HL may be disposed in the first or second coupling hole ST1 or ST2 of the housing HS. As to which coupling hole ST1 or ST2 may be used, may be determined by a user.

In an exemplary embodiment of the present invention, the handle HL may include a body BD and a fastening part HM. In an exemplary embodiment of the present invention, the body BD may have a rectangular shape extending in the second direction DR2. The fastening part HM may be coupled to the body BD and may have a shape extending in an extension direction of the body BD.

Figure 2A:
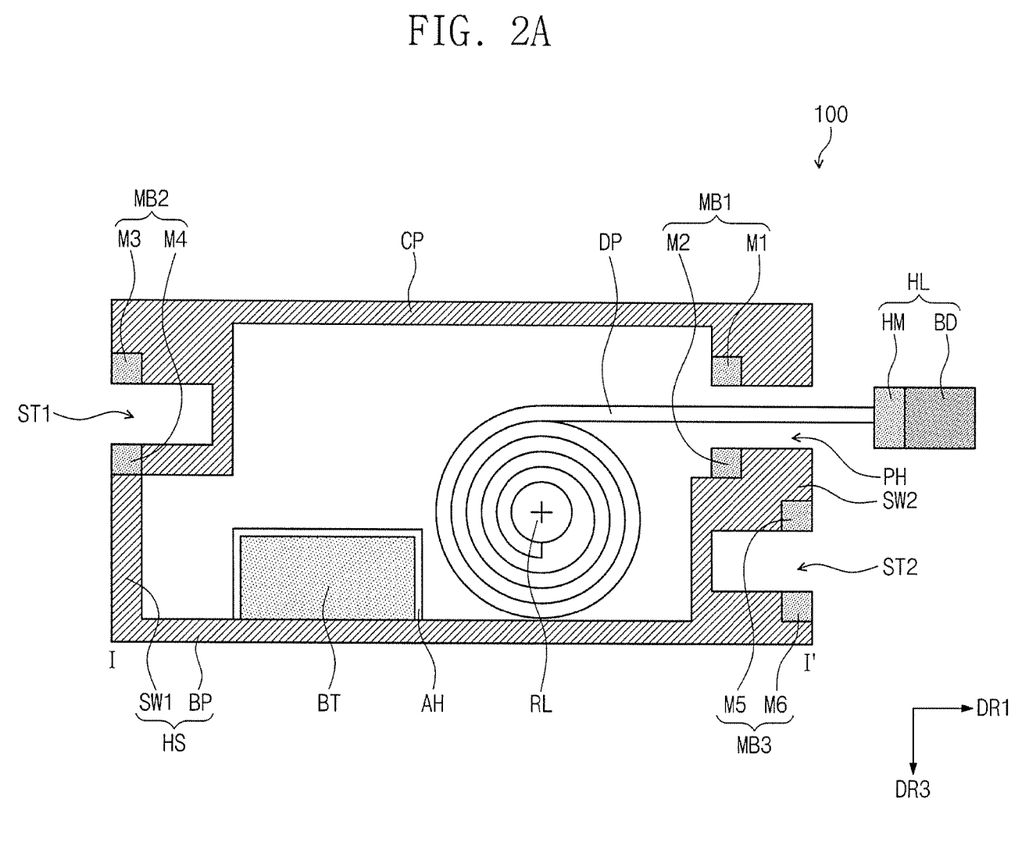
FIG. 2A is a cross-sectional view of a rollable display device taken along line I-I' of FIG. 1A.

Referring to the handle HL, the fastening part HM may be configured to be coupled to each of the outlet PH, the first coupling hole ST1, and the second coupling hole ST2. In an exemplary embodiment of the present invention, the fastening part HM may be, for example, a metal bar which may magnetically couple to a first magnet structure MB1 near the outlet PH, a second magnet structure MB2 near the first coupling hole ST1, or a third magnet structure MB3 near the second coupling hole ST2, as shown in FIG. 2A. In an exemplary embodiment of the present invention, the fastening part HM may be a magnetic element whose polarity is opposite to that of each of the first to third magnet structures MB1, MB2, and MB3.

The battery BT may be disposed in the housing HS. The battery BT may be electrically connected to the display panel DP and may be used to supply electric power to the display panel DP. In an exemplary embodiment of the present invention, the battery BT may be provided in a battery hole BH, which may be defined in a sidewall of the housing HS.

A structure of the rollable display device 100 will be described in more detail with reference to FIGS. 2A and 2B.

Figure 2B:
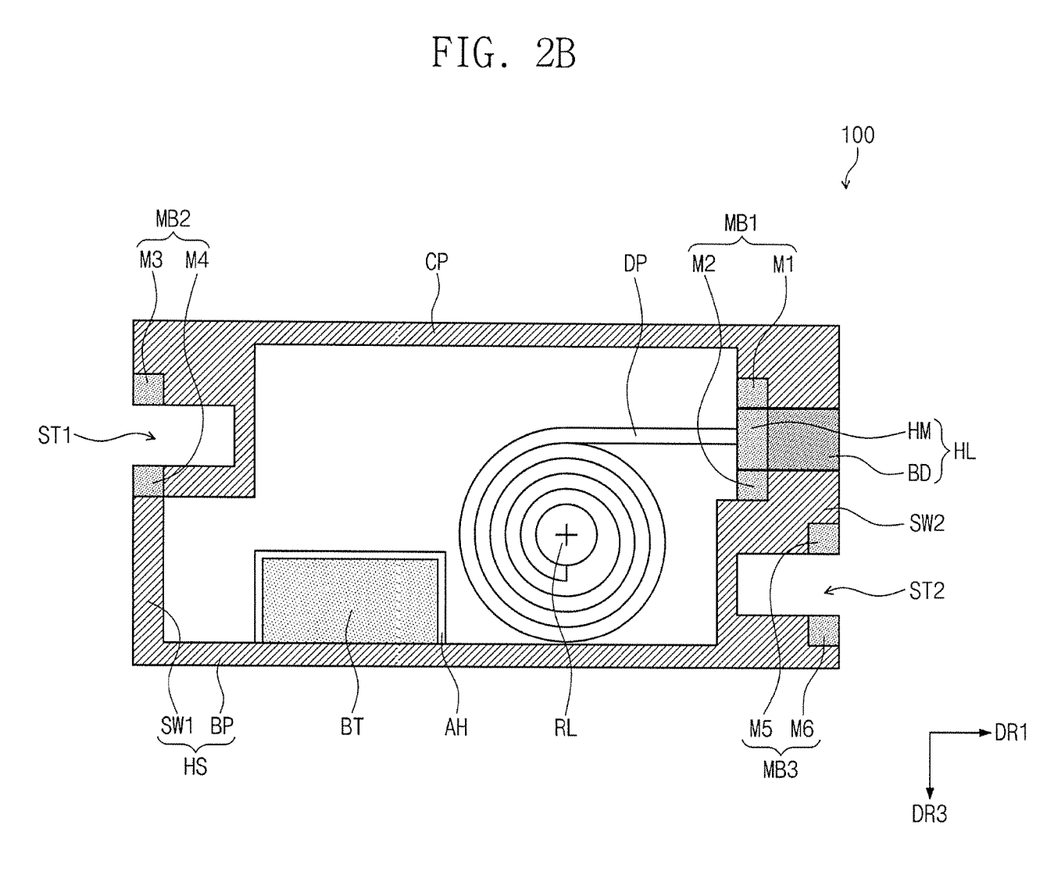
FIG. 2B is a cross-sectional view illustrating the rollable display device of FIG. 2A, in which a handle and an outlet are coupled to each other.

FIG. 2A is a cross-sectional view of the rollable display device 100 taken along line I-I' of FIG. 1A, and FIG. 2B is a cross-sectional view illustrating the rollable display device 100 of FIG. 2A, in which the handle HL and the outlet PH are coupled to each other.

Referring to FIGS. 2A and 2B, the housing HS may include a bottom portion BP, a plurality of sidewalls coupled to the bottom portion BP, and a cover portion CP. In FIGS. 2A and 2B, some of the sidewalls (e.g., first and second sidewall SW1 and SW2 facing each other) are illustrated. For example, the plurality of sidewalls may be substantially perpendicular to the bottom portion BP and the cover portion CP. Each of the first and second sidewalls SW1 and SW2 may be provided in such a way that its height direction extends in a third direction DR3 perpendicular to the first direction DR1.

The housing HS may include an outlet PH, a first coupling hole ST1, and a second coupling hole ST2 defined therein. In an exemplary embodiment of the present invention, the first coupling hole ST1 may be defined in the first sidewall SW1, the second coupling hole ST2 may be defined in the second sidewall SW2, and the outlet PH may be defined in the second sidewall SW2.

In an exemplary embodiment of the present invention, the first coupling hole ST1 may be a recessed region (e.g., a concave region) that is formed and defined in a portion of the first sidewall SW1, and the second coupling hole ST2 may be a recessed region (e.g., a concave region) that is formed and defined in a portion of the second sidewall SW2. The outlet PH may be an opening that is formed to penetrate a portion of the second sidewall SW2, and in the second sidewall SW2, the outlet PH may be spaced apart from the second coupling hole ST2.

The housing HS may include an auxiliary housing AH defined therein, and the battery BT may be disposed in the auxiliary housing AH. In an exemplary embodiment of the present invention, the battery BT and the roller RL may be arranged in the first direction DR1 between the first sidewall SW1 and second sidewall SW2.

The roller RL may be positioned in the housing HS in such a way that the display panel DP may be rolled around the roller RL. In other words, the roller RL may be configured to receive the display panel DP in a rolled up configuration. In addition, the roller RL may be positioned between and not touching the cover portion CP and the bottom portion BP. In the case where the display panel DP is not operated (e.g., when the rollable display device 100 is used in a portable manner by a user), most of the display panel DP may be rolled around the roller RL and may be disposed in the housing HS. By contrast, when the display panel DP is operated (e.g., when the rollable display device 100 is watched by a user), the display panel DP rolled around the roller RL may be unrolled from the roller RL, and the unrolled portion of the display panel DP may extend out of the housing HS through the outlet PH. For example, the display panel may pass through the outlet PH in an unrolled configuration in a first direction DR1.

In an exemplary embodiment of the present invention, the rollable display device 100 may include a rotating component, which may be coupled to the roller RL and may apply torque to the roller RL. In the case where the roller RL is rotated in a specific direction by the rotating component, the display panel DP may be rolled around the roller RL. In the case where the roller RL is rotated in a reverse direction of the specific direction by the rotating component, the display panel DP may extend out from the roller RL.

In an exemplary embodiment of the present invention, the housing HS may include a first magnet structure MB1, a second magnet structure MB2, and a third magnet structure MB3.

The first magnet structure MB1 may be provided around the outlet PH. In an exemplary embodiment of the present invention, the first magnet structure MB1 may include a first magnet M1 and a second magnet M2 spaced apart from each other with the outlet PH interposed therebetween, and the first and second magnets M1 and M2 may be coupled to the second sidewall SW2.

Accordingly, in the case where the handle HL is inserted into the outlet PH as shown in FIG. 2B, the fastening part HM may be a metal bar as previously described above, and an attractive force may be exerted between the first magnet structure MB1 and the fastening part HM to couple the handle HL to the outlet PH. Accordingly, when the handle HL is inserted into the outlet PH, the attractive force may prevent the handle HL from freely moving in the outlet PH.

The second magnet structure MB2 may be provided around the first coupling hole ST1. In an exemplary embodiment of the present invention, the second magnet structure MB2 may include a third magnet M3 and a fourth magnet M4 spaced apart from each other with the first coupling hole ST1 interposed therebetween, and the third and fourth magnets M3 and M4 may be coupled to the first sidewall SW1.

Figure 3A:
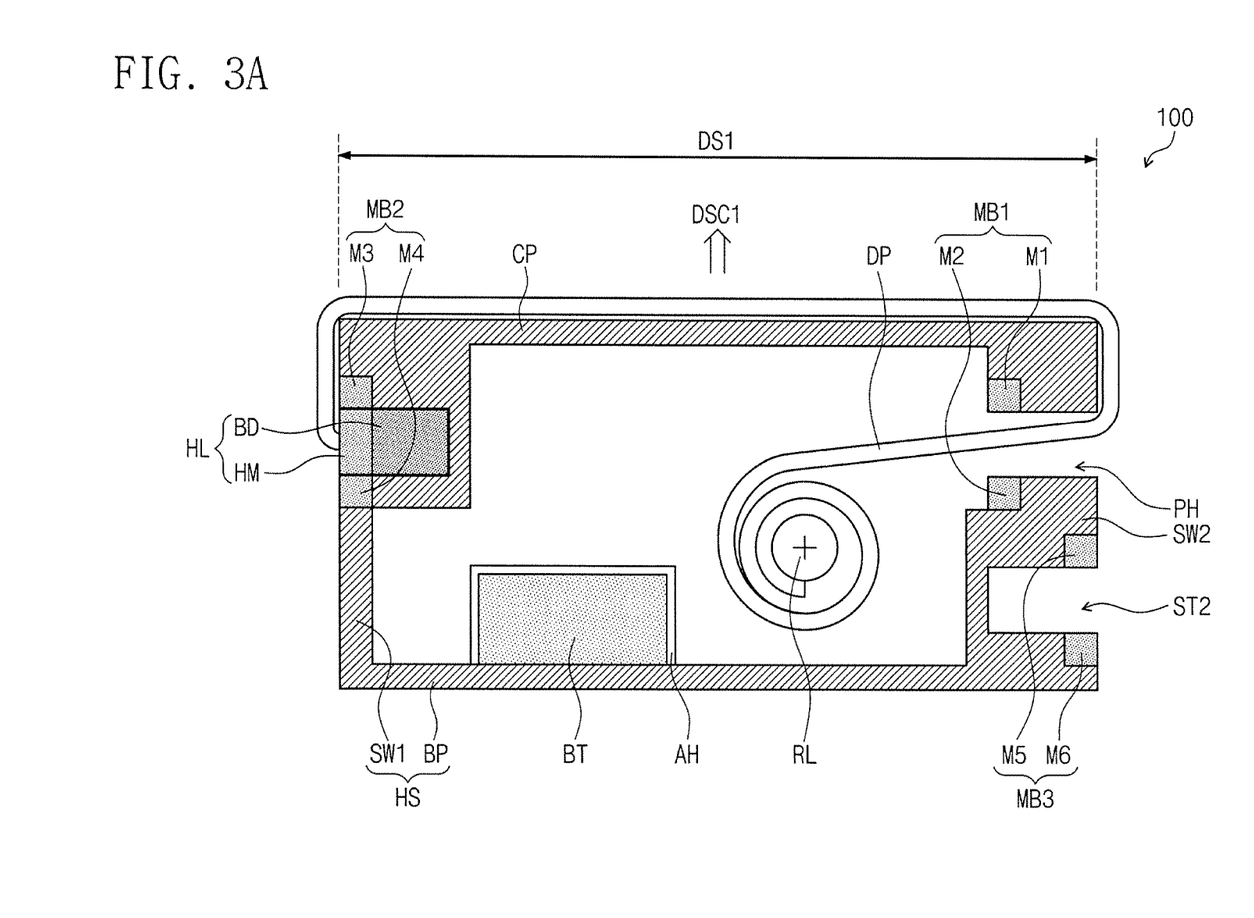
FIG. 3A is a cross-sectional view illustrating an image display mode of the rollable display device of FIG. 2A.

Accordingly, in the case where, as shown in FIG. 3A, the handle HL may be inserted into the first coupling hole ST1, an attractive force may be exerted between the second magnet structure MB2 and the fastening part HM. Accordingly, if the handle HL is inserted into the first coupling hole ST1, the attractive force may prevent the handle HL from freely moving in the first coupling hole ST1.

The third magnet structure MB3 may be provided around the second coupling hole ST2. In an exemplary embodiment of the present invention, the third magnet structure MB3 may include a fifth magnet M5 and a sixth magnet M6 spaced apart from each other with the second coupling hole ST2 interposed therebetween. The fifth and sixth magnets M5 and M6 may be coupled to the second sidewall SW2.

Figure 3B:
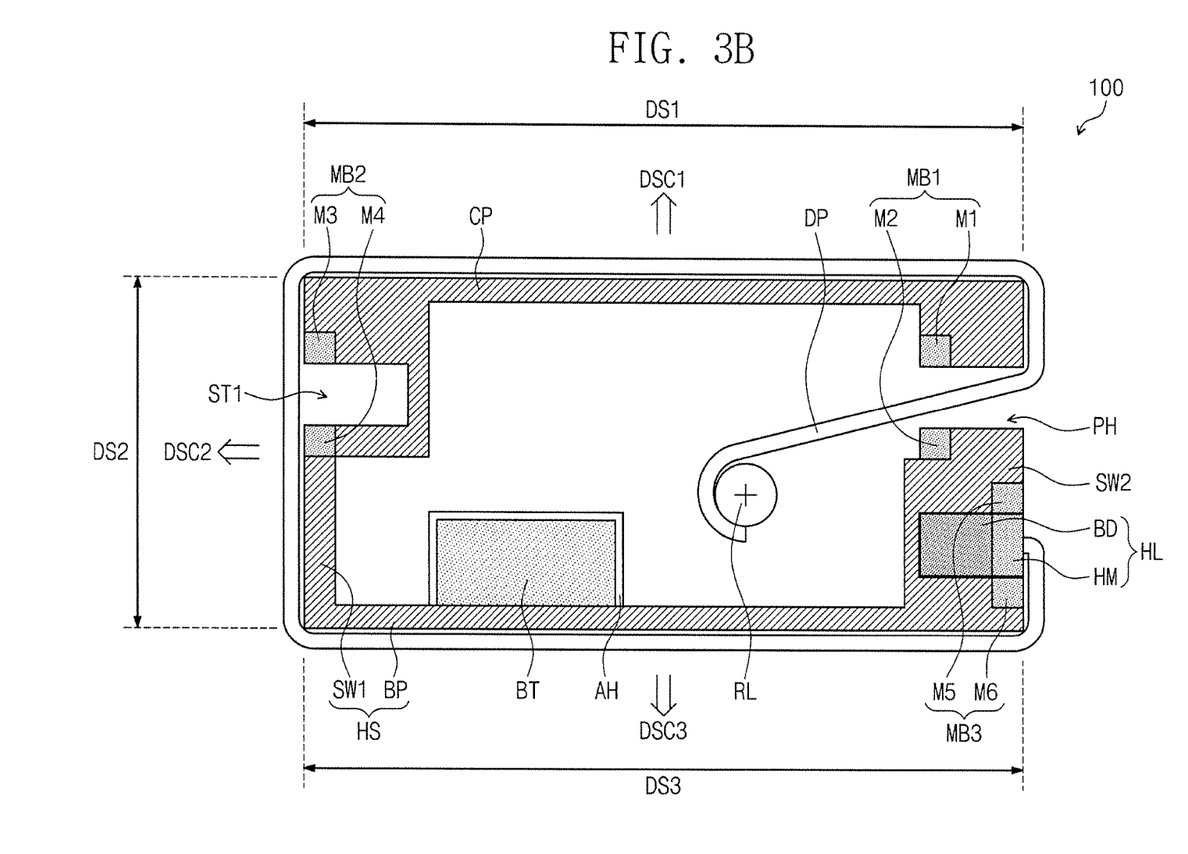
FIG. 3B is a cross-sectional view illustrating an image display mode of the rollable display device of FIG. 2A.

In the case where, as shown in FIG. 3B, the handle HL may be inserted into the second coupling hole ST2, an attractive force may be exerted between the third magnet structure MB3 and the fastening part HM. Accordingly, if the handle HL is inserted into the second coupling hole ST2, the attractive force may prevent the handle HL from freely moving in the second coupling hole ST2.

As described above, the handle HL may be temporarily coupled to or separated from the first coupling hole ST1 or the second coupling hole ST2, and thus, the handle HL may be coupled to the housing HS in various manners to display an image on the display panel DP, according to a user's purpose. Hereinafter, this will be described with reference to FIGS. 3A and 3B.

FIG. 3A is a cross-sectional view illustrating an image display mode of the rollable display device 100 of FIG. 2A. In the following description of FIG. 3A, previously described elements may be identified by an identical reference number without repeating an overlapping description thereof.

Referring to FIGS. 2A and 3A, a portion of the display panel DP may be rolled around the roller RL, and another portion of the display panel DP may be pulled out of the housing HS through the outlet PH. The other portion of the display panel DP pulled out of the housing HS may be disposed to overlap the cover portion CP of the housing HS. In other words, the display panel DP may extend from the roller RL to the first sidewall SW1 of the housing HS by overlapping the cover portion CP of the housing HS.

The handle HL may be disposed in the first coupling hole ST1, and due to an attractive force between the second magnet structure MB2 of the first coupling hole ST1 and the fastening part HM of the handle HL, the handle HL may be temporarily fastened in the first coupling hole ST1.

According to the aforementioned structure of the display panel DP, a first display light DSC1 may be emitted away or, for example, upward from the rollable display device 100. Accordingly, a first display surface DS1 of the display surface DS may overlap a top surface of the rollable display device 100, and thus, an image may be displayed by the first display surface DS1 of the rollable display device 100.

FIG. 3B is a cross-sectional view illustrating an image display mode of the rollable display device 100 of FIG. 2A. In the following description of FIG. 3B, previously described elements may be identified by an identical reference number without repeating an overlapping description thereof.

Referring to FIGS. 2A and 3B, a portion of the display panel DP may be rolled around the roller RL, and another portion of the display panel DP may be pulled out of the housing HS through the outlet PH. The other portion of the display panel DP pulled out of the housing HS may be disposed to overlap the cover portion CP, the first sidewall SW1, and the bottom portion BP of the housing HS. In other words, the display panel DP may extend from the roller RL to the second sidewall SW2 by overlapping the cover portion CP of the housing HS, the first sidewall SW1 of the housing HS and the bottom portion BP of the housing HS.

The handle HL may be disposed in the second coupling hole ST2, and due to an attractive force between the third magnet structure MB3 of the second coupling hole ST2 and the fastening part HM of the handle HL, the handle HL may be temporarily fastened in the second coupling hole ST2.

According to the aforementioned structure of the display panel DP, a first display light DSC1, a second display light DSC2, and a third display light DSC3 may be respectively emitted from the rollable display device 100 in upward, leftward or rightward, and bottomward directions. In other words, the display lights DSC1, DSC2, and DSC3 may be emitted in directions away from the rollable display device 100. In addition, the first, second and third display lights DSC1, DSC2 and DSC3 may be, for example, respectively emitted by first, second and third display surfaces DS1, DS2 and DS3 of the display surface DS. Accordingly, the first display surface DS1 may overlap the top surface of the rollable display device 100, the second display surface DS2 may overlap a left or right surface of the rollable display device 100, and the third display surface DS3 may overlap a bottom surface of the rollable display device 100. Thus, an image may be displayed by the first display surface DS1, second display surface DS2 and third display surface DS3 of the display panel DP.

Figure 4A:
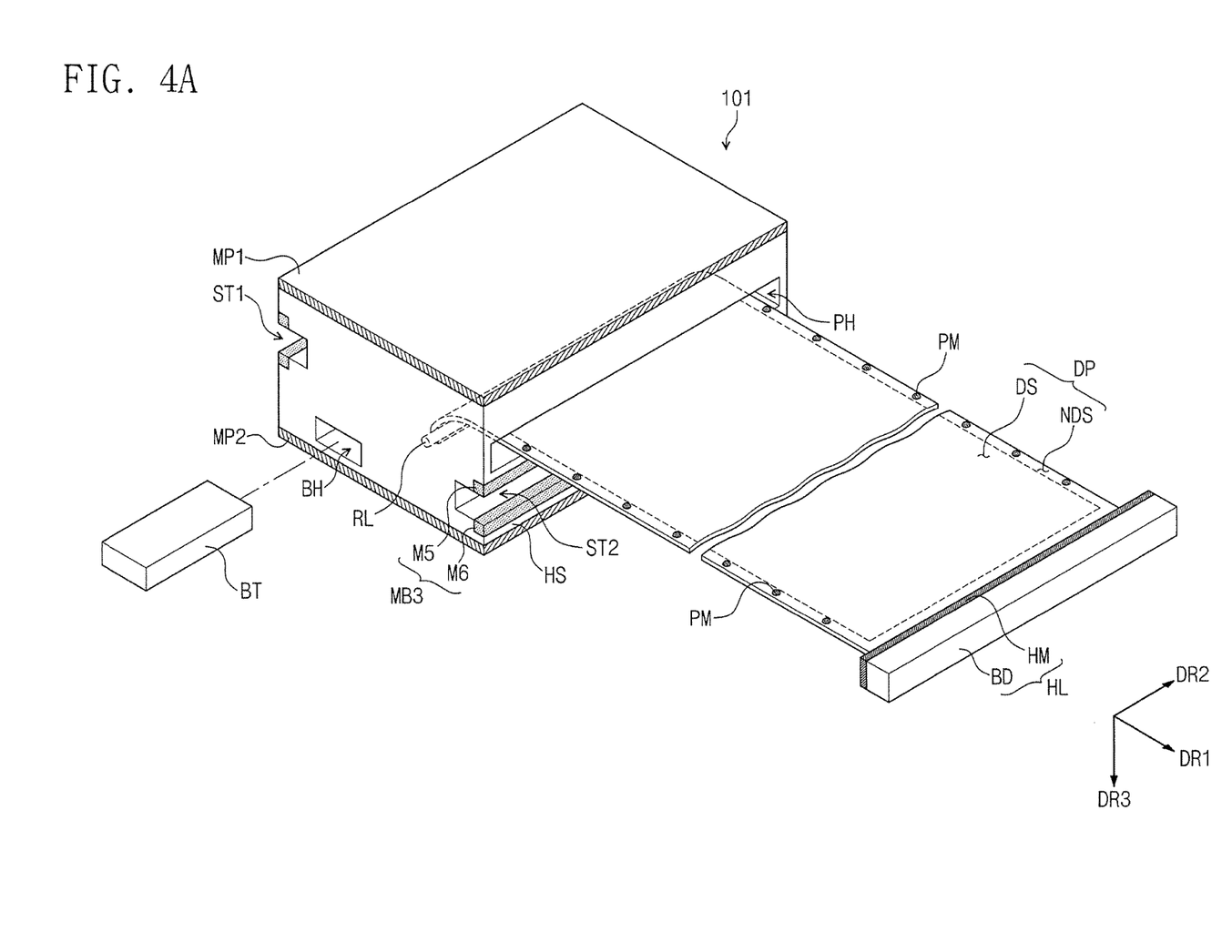
FIG. 4A is a perspective view of a rollable display device according to an exemplary embodiment of the present invention.
Figure 4B:
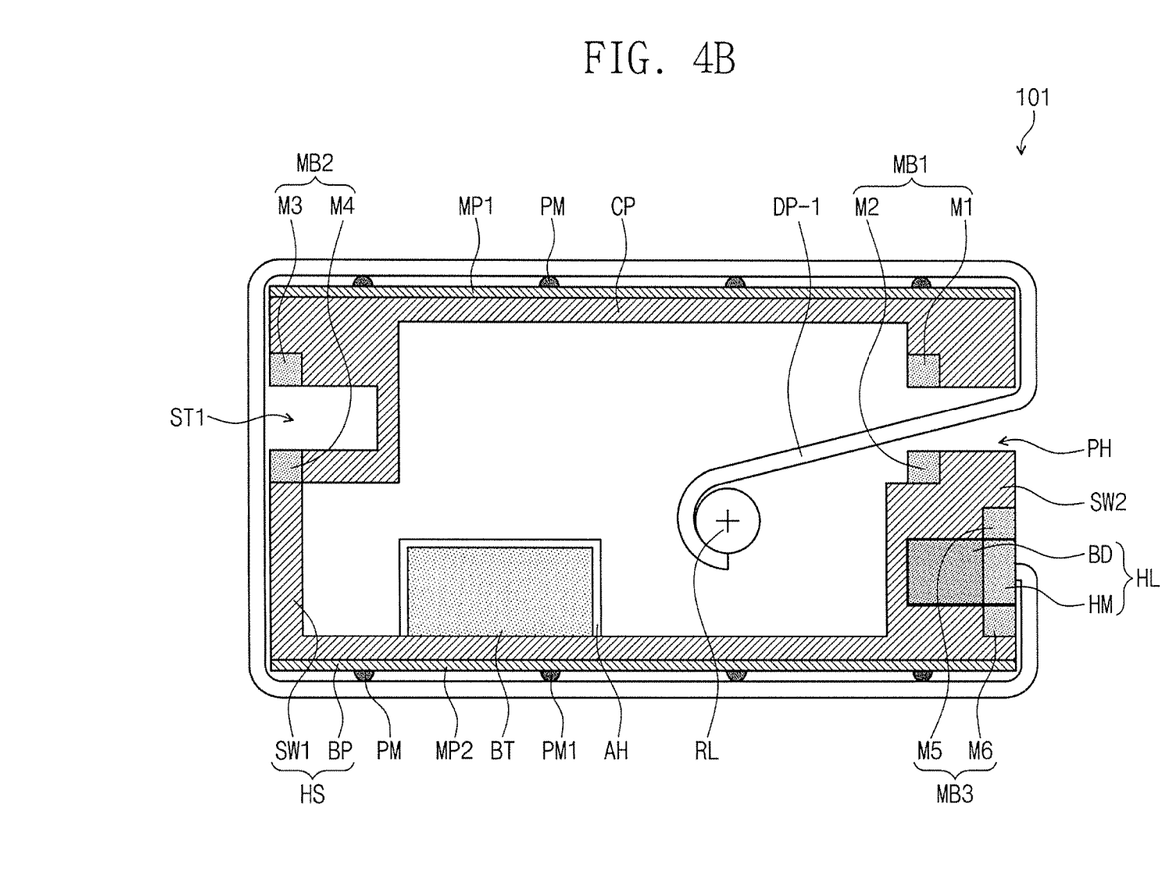
FIG. 4B is a cross-sectional view illustrating an image display mode of the rollable display device of FIG. 4A.

FIG. 4A is a perspective view of a rollable display device 101 according to an exemplary embodiment of the present invention, and FIG. 4B is a cross-sectional view illustrating an image display mode of the rollable display device 101 of FIG. 4A. In the following description of FIGS. 4A and 4B, previously described elements may be identified by an identical reference number without repeating an overlapping description thereof.

Referring to FIGS. 4A and 4B, the rollable display device 101 may further include a first metal plate MP1, a second metal plate MP2, and fourth magnet structures PM, when compared with the rollable display device 100 shown in FIG. 2A.

In an exemplary embodiment of the present invention, the housing HS may include a plastic element. The first metal plate MP1 may be disposed on the cover portion CP of the housing HS, and the second metal plate MP2 may be disposed on the bottom portion BP of the housing HS. For example, the first metal plate MP1 may cover at least a portion of the cover portion CP of the housing HS, and the second metal plate MP2 may cover at least a portion of the bottom portion of the housing HS.

The fourth magnet structures PM may be arranged on the non-display surface NDS of the display panel DP. In an exemplary embodiment of the present invention, the fourth magnet structures PM may be spaced apart from each other and may be disposed the non-display surface NDS of the display panel DP. In an exemplary embodiment of the present invention, the fourth magnet structures PM may be arranged in the first direction DR1 on the non-display surface NDS and may be disposed on both long sides of the non-display surface extending in the first direction DR1.

Similar to previously described exemplary embodiments of the present invention, a portion of the display panel DP pulled through the outlet PH may be extended to overlap the cover portion CP, the first sidewall SW1, and the bottom portion BP of the housing HS, and thus, an enlarged image may be displayed on the display panel DP. In addition, the handle HL may be disposed in the second coupling hole ST2.

Due to an attractive force between the third magnet structure MB3 of the second coupling hole ST2 and the fastening part HM of the handle HL, the handle HL may be temporarily fastened in the second coupling hole ST2. In addition, due to an attractive force between the fourth magnet structures PM and the first and second metal plates MP1 and MP2, the display panel DP may be temporarily fastened to the cover and bottom portions CP and BP of the housing HS. Accordingly, even when the display panel DP is unrolled from the roller RL, the display panel DP may be configured to stably display the enlarged image.

Figure 5:
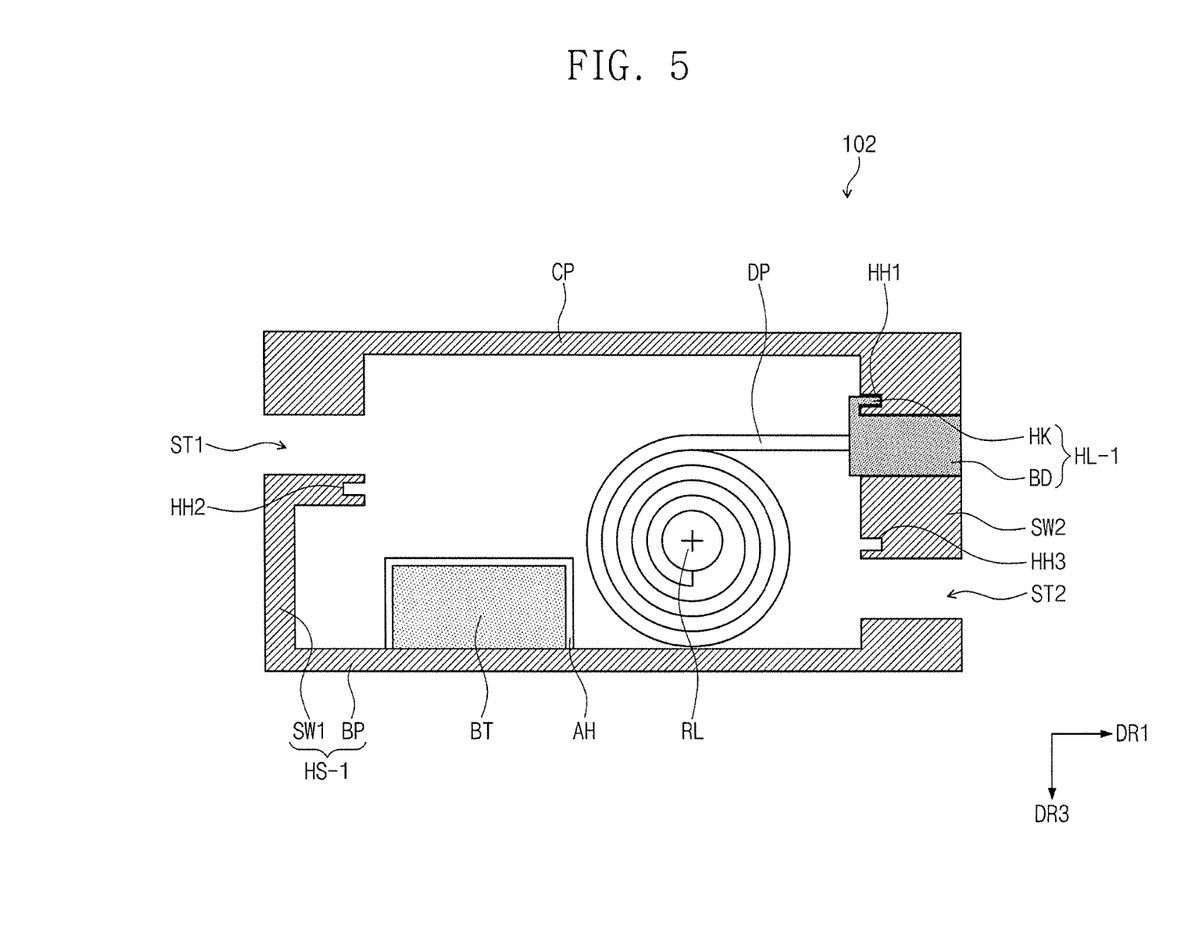
FIG. 5 is a cross-sectional view of a rollable display device according to an exemplary embodiment of the present invention.

FIG. 5 is a cross-sectional view of a rollable display device 102 according to an exemplary embodiment of the present invention. In the following description of FIG. 5, previously described elements may be identified by an identical reference number without repeating an overlapping description thereof.

Referring to FIG. 5, the rollable display device 102 may include a handle HL-1 with a hook portion HK, instead of the fastening part HM shown in FIG. 2A. Here, the hook portion HK may be provided in the form of a hook. In an exemplary embodiment of the present invention, the hook portion HK may be a rectangular or rounded hook extending from the body BD of the handle HL-1.

A housing HS-1 of the rollable display device 102 may include a first fastening groove HH1, a second fastening groove HH2, and a third fastening groove HH3, instead of the first to third magnet structures MB1, MB2, and MB3 of FIG. 2A.

In an exemplary embodiment of the present invention, a first coupling hole ST1 and a second coupling hole ST2 may penetrate a sidewall of the housing HS-1.

The first fastening groove HH1 may be defined in the second sidewall SW2 of the housing HS-1 adjacent to the outlet PH, and the second fastening groove HH2 may be defined in the first sidewall SW1 of the housing HS-1 adjacent to the first coupling hole ST1. The third fastening groove HH3 may be defined in the second sidewall SW2 of the housing HS-1 adjacent to the second coupling hole ST2.

In the case where most of the display panel DP is rolled around the roller RL (e.g., when the rollable display device 100 is used in a portable manner by a user), the handle HL-1 may be disposed in the outlet PH of the housing HS-1 and the hook portion HK may be coupled to the first fastening groove HI-11. For example, the hook portion HK may be disposed in the first fastening groove HH1, which has a shape corresponding to a shape of the hook portion HK.

In the case where, as shown in FIG. 3A, the display panel DP is unrolled from the roller RL, the handle HL-1 may be disposed in the first coupling hole ST1, and in this case, the hook portion HK of the handle HL-1 may be coupled to the second fastening groove HH2.

In the case where, as shown in FIG. 3B, the display panel DP is unrolled from the roller RL, the handle HL-1 may be disposed in the second coupling hole ST2, and in this case, the hook portion HK of the handle HL-1 may be coupled to the third fastening groove HH3.

The display panel DP may be unrolled from the roller RL for an image to be displayed by the rollable display device 101 in various modes since the hook portion HK of the handle HL-1 may be coupled to one of the second or third fastening grooves HH2 or HH3 of the housing HS-1. Thus, when the display panel DP is unrolled from the roller RL, the display panel DP may stably display the image and a shape of the unrolled portion of the display panel DP may be maintained.

In tan exemplary embodiment of the present invention, the hook portion HK may be coupled to the first to third fastening grooves HH1, HH2, and HH3 in a hook manner, as described above. However, the present invention is not limited to a method of coupling the hook portion HK to the first to third fastening grooves HH1, HH2, and HH3. For example, in an exemplary embodiment of the present invention, the hook portion HK may have a protruding shape that may be extended from the body BD of the handle HL-1, and each of the first to third fastening grooves HH1, HH2, and HH3 may be a concave or recessed structure, in which the hook portion HK may be disposed.

According to an exemplary embodiment of the present invention, a rollable display device may include a display panel with a handle and a housing with a coupling hole and connected to the display panel. The handle and the coupling hole may be coupled to each other to temporarily fasten the display panel to the housing, when the rollable display device displays an image. In addition, a shape of the display panel extended from the housing may be maintained.

In addition, when a portion of the display panel is extended from the housing, a shape of the display panel may be variously changed depending on a position of the coupling hole which may be coupled to the handle of the display panel. Thus, various shapes of the display panel may be provided and an image may be displayed on an enlarged display surface, when the rollable display device is watched by a user.

Exemplary embodiments of the present invention provide a rollable display device configured to have many variations in a shape.

While the present invention has been particularly shown and described with reference to exemplary embodiments thereof, it will be apparent to those of ordinary skill in the art that various changes in form and detail may be made thereto without departing from the spirit and scope of the present invention.

What is claimed is:

1. A rollable display device, comprising:
   a display panel having a flexible property;
   a roller configured to receive the display panel in a rolled-up configuration;
   a handle coupled to an end portion of the display panel; and
   a housing configured to house the roller and the display panel in the rolled-up configuration, the housing includes an outlet, which the display panel passes through in an unrolled configuration, and a first coupling hole disposed apart from the outlet and is configured to receive the handle.

2. The rollable display device of claim 1, wherein the housing further comprises:
   a bottom portion;
   a first sidewall coupled to the bottom portion;
   a second sidewall coupled to the bottom portion, wherein the first and second sidewalls face each other; and
   a cover portion connecting the first and second sidewalls to each other, facing the bottom portion, and covering the roller,
   wherein the first coupling hole is defined in the first sidewall, and the outlet is defined in the second sidewall.

3. The rollable display device of claim 2, wherein the housing includes a second coupling hole defined in the second sidewall, and the second coupling hole is spaced apart from the outlet.

4. The rollable display device of claim 3, wherein the first coupling hole is a recessed region defined in the first sidewall, the second coupling hole is a recessed region defined in the second sidewall, and the outlet is an opening region defined in the second sidewall.

5. The rollable display device of claim 2, further comprising a battery disposed in the housing.

6. The rollable display device of claim 1, wherein the housing comprises a first magnet structure which is positioned near the outlet, and
   wherein the handle includes a metal material.

7. The rollable display device of claim 1, wherein the housing comprises a second magnet structure which is positioned near the first coupling hole, and
   wherein the handle includes a metal material.

8. The rollable display device of claim 1, wherein the handle comprises a hook portion, and the first coupling hole includes a fastening groove which corresponds to a shape of the hook portion.

9. The rollable display device of claim 1, further comprising a third magnet structure which is disposed on a non-display surface of the display panel.

10. The rollable display device of claim 9, further comprising a metal plate disposed between the housing and the third magnet structure.

11. A rollable display device, comprising:
    a housing including an outlet;
    a roller disposed in the housing;
    a display panel which is coupled to the roller and has a flexible property; and
    a handle coupled to an end portion of the display panel,
    wherein a first portion of the display panel is rolled around the roller,
    a second portion of the display panel is extended from the housing through the outlet in a first direction, and the second portion of the display panel overlaps at least a first sidewall of the housing, and
    the handle is disposed in a coupling hole defined in the housing.

12. The rollable display device of claim 11, wherein the housing comprises:
    a bottom portion;
    the first sidewall coupled to the bottom portion;
    a second sidewall coupled to the bottom portion, wherein the first and second sidewalls face each other with the roller interposed therebetween; and
    a cover portion connecting the first and second sidewalls to each other, facing the bottom portion, and covering the roller.

13. The rollable display device of claim 12, wherein the coupling hole is defined in the first sidewall, and the outlet is defined in the second sidewall.

14. The rollable display device of claim 12, wherein the coupling hole and the outlet are defined in one of the first or second sidewalls and are spaced apart from each other.

15. The rollable display device of claim 12, wherein the coupling hole comprises a first coupling hole defined in the first sidewall and a second coupling hole defined in the second sidewall,
    the outlet is defined in the second sidewall and is spaced apart from the second coupling hole, and
    the handle is disposed in one of the first or second coupling holes.

16. The rollable display device of claim 12, further comprising:
    a metal plate disposed on each of the bottom and cover portions of the housing;
    a third magnet structure disposed on a non-display surface of the display panel; and
    a metal plate disposed between the housing and the third magnet structure.

17. The rollable display device of claim 11, further comprising a battery disposed in the housing.

18. The rollable display device of claim 11, wherein the housing comprises a first magnet structure which is positioned near the outlet, and
    wherein the handle includes a metal material.

19. The rollable display device of claim 11, wherein the housing comprises a second magnet structure which is positioned near the coupling hole, and
    wherein the handle includes a metal material.

20. The rollable display device of claim 11, wherein the handle comprises a hook portion, and
    the coupling hole includes a fastening groove which corresponds to a shape of the hook portion.

* * * * *